US012774525B2

(12) United States Patent
Lee et al.

(10) Patent No.: US 12,774,525 B2
(45) Date of Patent: Oct. 27, 2026

(54) SUBSTRATE STAGE AND SUBSTRATE PROCESSING APPARATUS INCLUDING THE SAME

(71) Applicant: SAMSUNG ELECTRONICS CO., LTD., Suwon-si (KR)

(72) Inventors: Jihyeong Lee, Suwon-si (KR); Sangyeon Oh, Suwon-si (KR); Minsung Kim, Suwon-si (KR); Byeongsang Kim, Suwon-si (KR); Yihwan Kim, Suwon-si (KR); Sangchul Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 652 days.

(21) Appl. No.: 18/215,916

(22) Filed: Jun. 29, 2023

(65) Prior Publication Data

US 2024/0167162 A1 May 23, 2024

(30) Foreign Application Priority Data

Nov. 22, 2022 (KR) ........................ 10-2022-0156934

(51) Int. Cl.
*C23C 16/458* (2006.01)
*C23C 16/46* (2006.01)

(52) U.S. Cl.
CPC ...... *C23C 16/4586* (2013.01); *C23C 16/4581* (2013.01); *C23C 16/46* (2013.01)

(58) Field of Classification Search
None
See application file for complete search history.

(56) References Cited

U.S. PATENT DOCUMENTS

| | | | | | |
|---|---|---|---|---|---|
| 3,927,247 | A * | 12/1975 | Timmons | H01B 11/1826 | 174/115 |
| 10,032,608 | B2 | 7/2018 | Chen et al. | | |
| 11,414,760 | B2 | 8/2022 | Um et al. | | |
| 2007/0044916 | A1 * | 3/2007 | Isozaki | C23C 28/00 | 156/345.52 |
| 2010/0163188 | A1 * | 7/2010 | Tanaka | H01L 21/68742 | 156/345.52 |
| 2012/0103970 | A1 * | 5/2012 | Lubomirsky | H01L 21/68792 | 219/460.1 |
| 2015/0194326 | A1 * | 7/2015 | Zhou | H01L 21/68792 | 156/345.48 |
| 2017/0306494 | A1 | 10/2017 | Lin et al. | | |

(Continued)

*Primary Examiner* — Jason Berman
(74) *Attorney, Agent, or Firm* — Muir Patent Law, PLLC

(57) ABSTRACT

A substrate processing apparatus includes a chamber providing a space for performing a semiconductor process on a semiconductor substrate, and a substrate stage configured to support the semiconductor substrate. The substrate stage includes a platen having a seating surface to support the semiconductor substrate, the platen having a resistance heater and an RF electrode adjacent to the seating surface, a shaft under the platen, the shaft having a first through hole in a central region and a plurality of second through holes in a peripheral region surrounding the central region, an RF rod spaced apart from an inner wall of the first through hole, the RF rod electrically connected to the RF electrode, and a plurality of heater rods respectively within the plurality of second through holes and electrically connected to the resistance heater.

20 Claims, 3 Drawing Sheets

(56) References Cited

U.S. PATENT DOCUMENTS

| | | | |
|---|---|---|---|
| 2021/0104384 A1 | 4/2021 | Parkhe | |
| 2021/0242047 A1 | 8/2021 | Kajihara et al. | |
| 2022/0108909 A1 | 4/2022 | Tamura | |
| 2022/0254634 A1 * | 8/2022 | Burrows | H01L 21/67109 |

* cited by examiner

SUBSTRATE STAGE AND SUBSTRATE PROCESSING APPARATUS INCLUDING THE SAME

CROSS-REFERENCE TO RELATED APPLICATION

This application claims priority under 35 U.S.C. § 119 to Korean Patent Application No. 10-2022-0156934, filed on Nov. 22, 2022, in the Korean Intellectual Property Office (KIPO), the contents of which are herein incorporated by reference in their entirety.

BACKGROUND

1. Field

Example embodiments relate to a substrate stage and a substrate processing apparatus including the same. More particularly, example embodiments relate to a substrate stage for supporting a semiconductor substrate to perform a semiconductor process and a substrate processing apparatus including the same.

2. Description of the Related Art

In a deposition process using a chemical vapor deposition (CVD) process, a semiconductor substrate may be magnetically fixed on a substrate stage through a radiofrequency (RF) electrode. For example, such a substrate stage may include an RF rod, a heater rod, a sensor rod, etc.

SUMMARY

According to example embodiments, a substrate processing apparatus includes a chamber providing a space for performing a semiconductor process on a semiconductor substrate therein, and a substrate stage configured to support the semiconductor substrate. The substrate stage includes a platen having a seating surface on which the semiconductor substrate is seated, the platen having a resistance heating element and an RF electrode that is provided adjacent to the seating surface, a shaft provided under the platen, the shaft having a first through hole provided in a central region and a plurality of second through holes provided in a peripheral region surrounding the central region, an RF rod provided to be spaced apart from an inner wall of the first through hole, the RF rod electrically connected to the RF electrode, and a plurality of heater rods respectively provided within the plurality of second through holes, the plurality of heater rods electrically connected to the resistance heating element.

According to example embodiments, a substrate processing apparatus includes a chamber providing a space where a deposition process is performed on a semiconductor substrate therein, and a substrate stage configured to support the semiconductor substrate. The substrate stage includes a platen having a seating surface on which the semiconductor substrate is seated thereon, the platen having an RF electrode provided adjacent to the seating surface and a resistance heating element provided under the RF electrode, a shaft provided under the platen, the shaft having a first through hole provided in a central region and a plurality of second through holes provided in a peripheral region surrounding the central region, an RF rod provided within the first through hole, the RF rod electrically connected to the RF electrode, a first power supply portion electrically connected to the RF rod, the first power supply portion configured to supply electrostatic force to the RF electrode to fix the semiconductor substrate on the seating surface, a plurality of heater rods respectively provided within the plurality of second through holes, the plurality of heater rods electrically connected to the resistance heating element, and a second power supply portion electrically connected to the heater rods, the second power supply portion configured to supply power to the resistance heating element to generate heat.

According to example embodiments, a substrate stage for a substrate processing apparatus includes a platen having a seating surface on which a semiconductor substrate is seated, the platen including an RF electrode provided adjacent to the seating surface, a resistance heating element provided under the RF electrode, and a sensor configured to obtain electrical signal data of the RF electrode and temperature data of the resistance heating element, a shaft provided under the platen, the shaft having a first through hole provided in a central region, a plurality of second through holes provided in a peripheral region surrounding the central region, and a third through hole provided in the peripheral region, an RF rod provided to be spaced apart from an inner wall of the first through hole and electrically connected to the RF electrode, a first power supply portion electrically connected to the RF rod, the first power supply portion configured to supply electrostatic force to the RF electrode to magnetically fix the semiconductor substrate on the seating surface, a plurality of heater rods provided in the second through holes and electrically connected to the resistance heating element, a second power supply portion electrically connected to the heater rods, the second power supply portion configured to supply power to the resistance heating element to generate heat, and a sensor rod provided within the third through hole and electrically connected to the sensor.

According to example embodiments, a substrate processing apparatus may include a chamber providing a space for performing a semiconductor process on a semiconductor substrate therein, and a substrate stage configured to support the semiconductor substrate. The substrate stage includes a platen having a seating surface on which the semiconductor substrate is seated, the platen having a resistance heating element and an RF electrode that is provided adjacent to the seating surface, a shaft provided under the platen, the shaft having a first through hole provided in a central region and a plurality of second through holes provided in a peripheral region surrounding the central region, an RF rod provided to be spaced apart from an inner wall of the first through hole, the RF rod electrically connected to the RF electrode, and a plurality of heater rods respectively provided within the plurality of second through holes, the plurality of heater rods electrically connected to the resistance heating element.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, example embodiments will be explained in detail with reference to the accompanying drawings.

Figure 1:
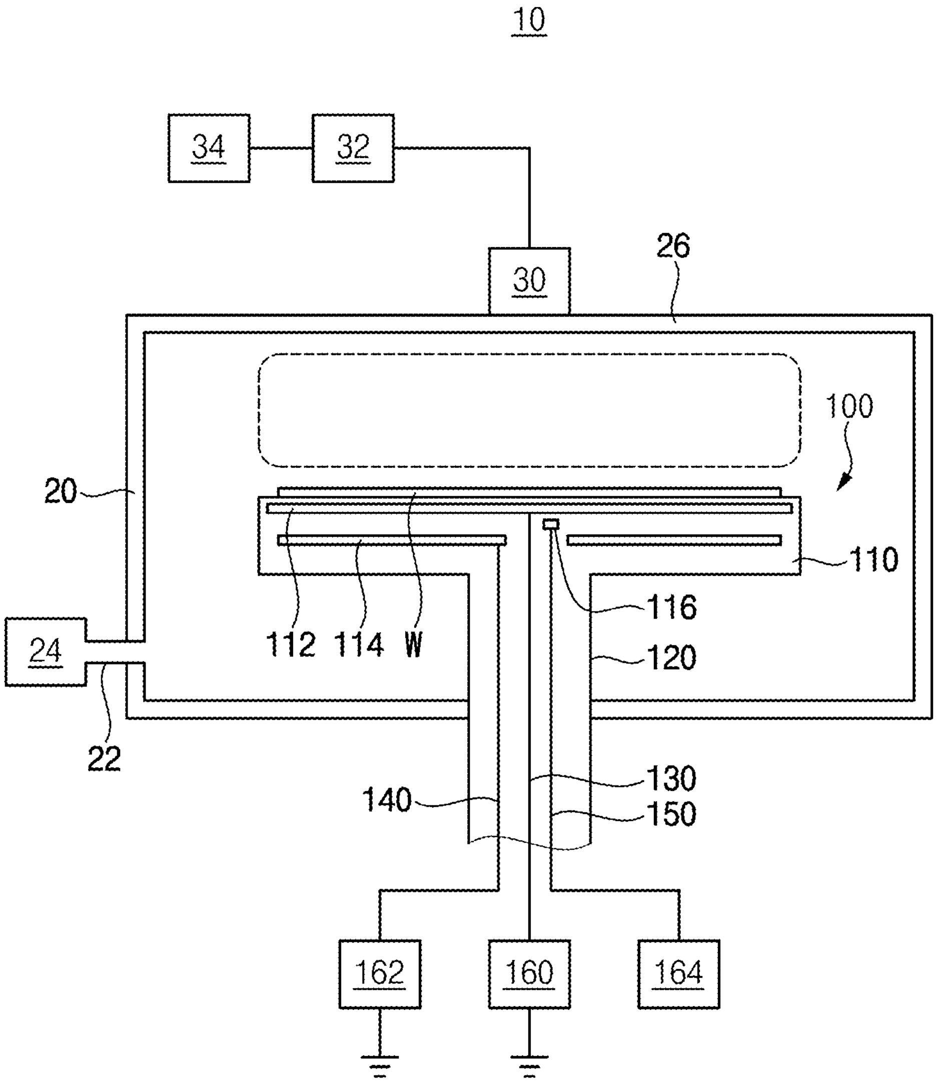
FIG. 1 is a schematic view illustrating a substrate processing apparatus in accordance with example embodiments.
Figure 2:
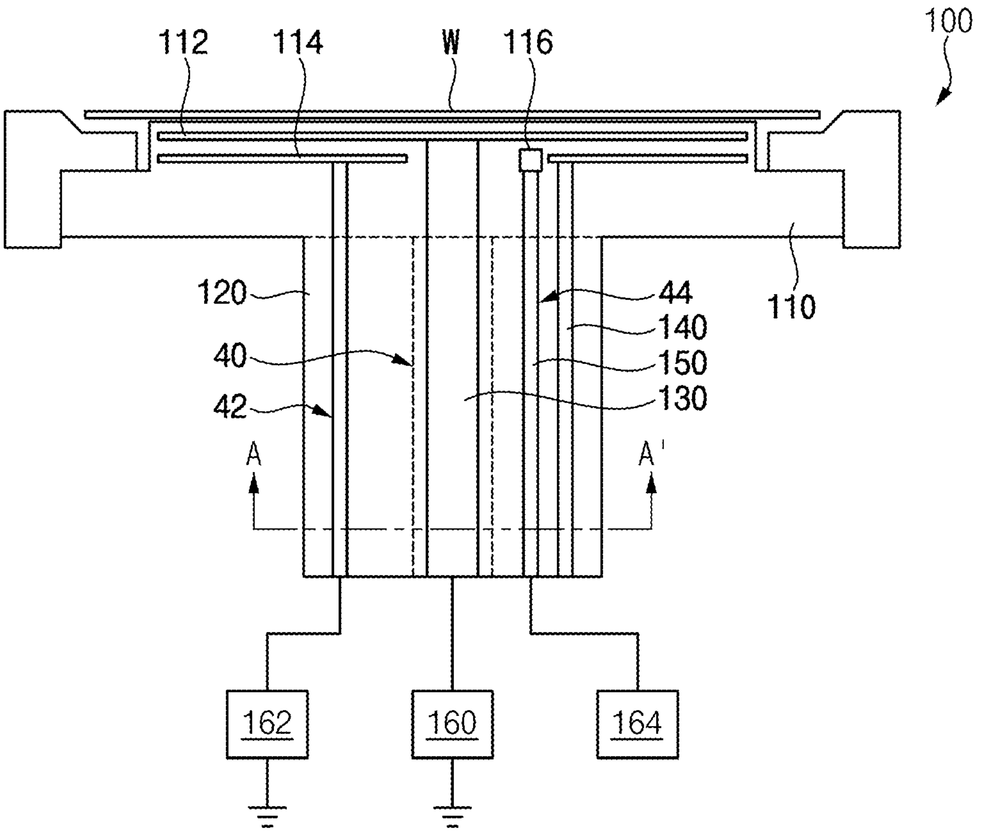
FIG. 2 is a schematic view illustrating the substrate stage in FIG. 1 in accordance with example embodiments.
Figure 3:
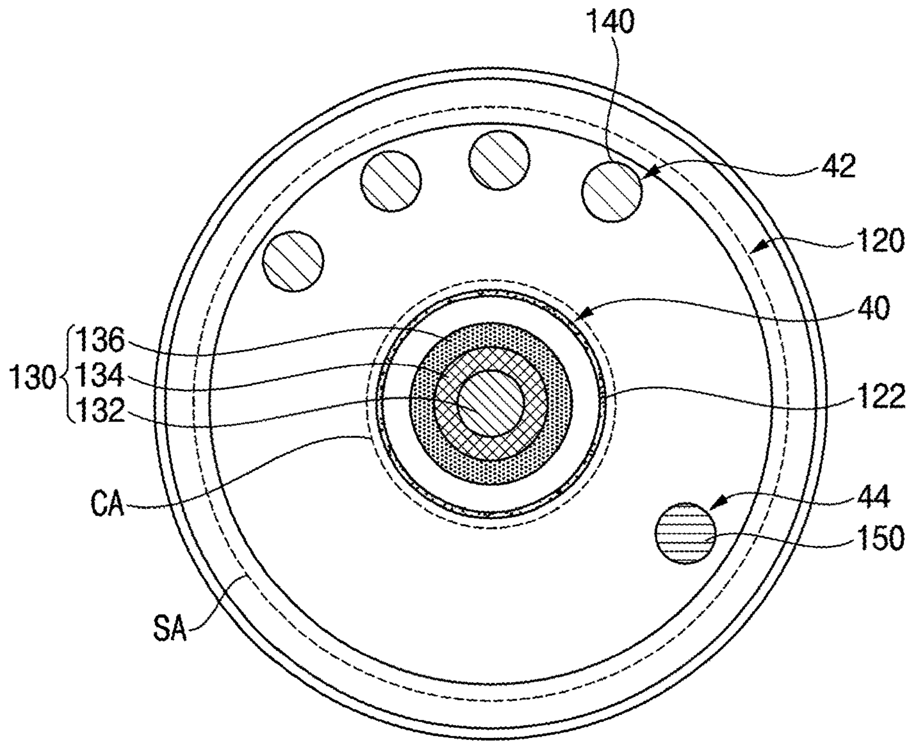
FIGS. 3 and 4 are cross-sectional views taken along line A-A' in FIG. 2.
Figure 4:
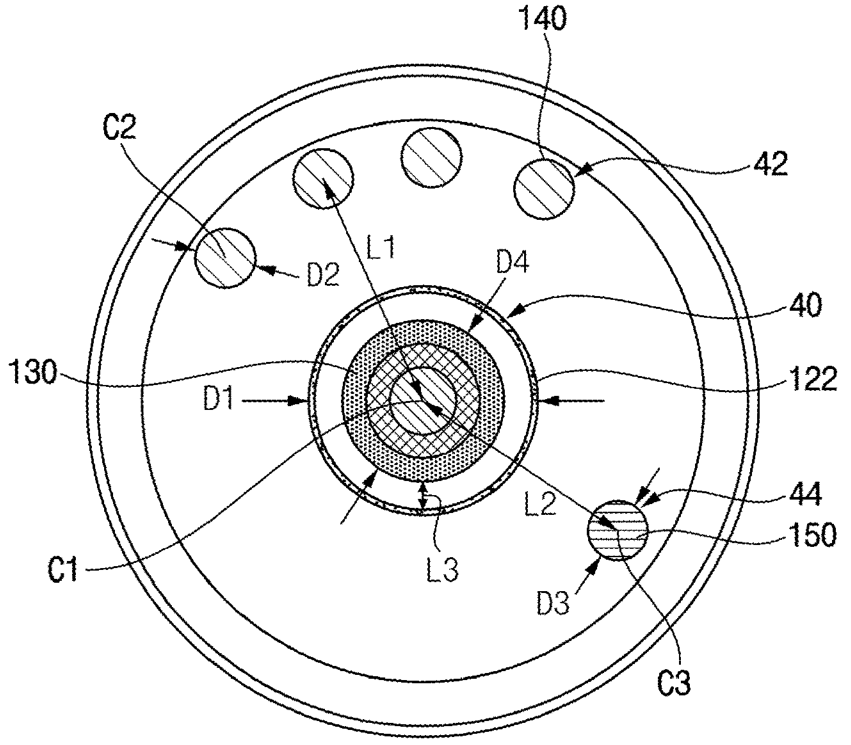

FIG. 1 is a view illustrating a substrate processing apparatus in accordance with example embodiments. FIG. 2 is a view illustrating the substrate stage in FIG. 1 in accordance with example embodiments. FIGS. 3 and 4 are cross-sectional views taken along the line A-A' in FIG. 2 that illustrate a top view of the shaft in the substrate stage.

Referring to FIGS. 1 to 4, a substrate processing apparatus 10 may include a chamber 20 providing a space for performing a semiconductor process, e.g., a deposition process, on a semiconductor substrate W, and a substrate stage 100 configured to support the semiconductor substrate W inside the chamber 20. The substrate stage 100 may be within the interior space of the chamber 20.

For example, the substrate processing apparatus 10 may be a deposition apparatus for a chemical vapor deposition (CVD) process. The deposition apparatus may deposit a target film on the semiconductor substrate W, e.g., a semiconductor wafer, arranged in the chamber 20. In another example, the substrate processing apparatus 10 may be an etching device, a cleaning device, and the like. Here, the semiconductor substrate W may include, e.g., a semiconductor substrate, a glass substrate, and the like.

In example embodiments, the chamber 20 may provide an enclosed space for performing the chemical vapor deposition process on the semiconductor substrate W. The chamber 20 may include a cylindrical vacuum chamber. The chamber 20 may include a metal, e.g., aluminum or stainless steel.

The substrate stage 100 that is capable of supporting the semiconductor substrate W may be provided inside the chamber 20. For example, the substrate stage 100 may serve as a susceptor that is capable of supporting the semiconductor substrate W.

A gate may be installed on a sidewall of the chamber 20 to allow access of the semiconductor substrate W. The semiconductor substrate W may be loaded and unloaded onto the substrate stage 100 through the gate.

An exhaust port 22 may be installed at a lower portion of the chamber 20, and an exhaust portion 24 may be connected to the exhaust port 22 through an exhaust pipe. The exhaust portion 24 may include a vacuum pump, e.g., a turbo molecular pump, to adjust a processing space inside the chamber 20 to a desired vacuum level. In addition, process by-products and residual process gases generated in the chamber 20 may be discharged through the exhaust portion 24.

The chamber 20 may include a cover 26 covering an upper portion of the chamber 20. The cover 26 may seal the upper portion of the chamber 20.

In example embodiments, the substrate processing apparatus 10 may further include a gas supply portion (e.g., a gas supply) that is capable of supplying gas into the chamber 20. For example, the gas supply portion may include gas supply pipes 30, a flow controller 32, and a gas supply source 34. The gas supply pipes 30 may supply various gases into the top portion and/or a side portion of the chamber 20. For example, the gas supply pipes 30 may include a vertical gas supply pipe penetrating through the cover 26 into the top portion of the chamber 20, and a horizontal gas supply pipe penetrating through the side portion of the chamber 20. The vertical gas supply pipe and the horizontal gas supply pipe may directly supply the various gases into the chamber 20.

The gas supply portion may supply different gases at a desired ratio. The gas supply source 34 may store a plurality of gases, and the gases may be supplied through a plurality of gas lines respectively connected to the gas supply pipes 30. The flow controller 32 may control a supply flow rate of the gases introduced into the chamber 20 through the gas supply pipes 30. The flow controller 32 may independently or commonly control the supply flow rates of the gases supplied to the vertical gas supply pipe and the horizontal gas supply pipe, respectively. For example, the gas supply source 34 may include a plurality of gas tanks, and the flow controller 32 may include a plurality of mass flow controllers (MFCs) that are respectively corresponded to the gas tanks. The mass flow controllers may independently control the supply flow rates of the gases.

In example embodiments, the substrate stage 100 may include a platen 110 having an RF electrode 112 and a resistance heating element 114 (e.g., a resistance heater), a shaft 120 provided under the platen 110, an RF rod 130 electrically connected to the RF electrode 112, and a plurality of heater rods 140 electrically connected to the resistance heating element 114. The substrate stage 100 may further include a sensor rod 150 electrically connected to a sensor 116 that is capable of obtaining temperature data from the resistance heating element 114. The substrate stage 100 may be provided inside the chamber 20 to support the semiconductor substrate W, and may control temperature of the substrate stage 100 during the chemical vapor deposition process.

In example embodiments, the platen 110 may have a seating surface that the semiconductor substrate W is arranged thereon. The platen 110 may include the RF electrode 112 that is capable of magnetically fixing the semiconductor substrate W onto the seating surface, and the resistance heating element 114 that is capable of controlling the temperature of the semiconductor substrate W. The platen 110 may further include the sensor 116 that is capable of obtaining the temperature data of the resistance heating element 114.

The RF electrode 112 may be provided adjacent to the seating surface. The RF electrode 112 may adsorb and hold the semiconductor substrate W by electrostatic force that is generated from a DC voltage. The DC voltage may be supplied from a DC power supply portion. For example, the RF electrode 112 may provide the seating surface that is capable of directly contacting and supporting the semiconductor substrate W. In another example, the RF electrode 112 may be embedded in the platen 110 to support the semiconductor substrate W. For example, the RF electrode 112 may be connected to a first power supply portion 160 (e.g., a first power supply) to receive the electrostatic force. In another example, the RF electrode 112 may be connected to a separate DC power supply portion to receive the electrostatic force.

For example, after the semiconductor substrate W is arranged on the RF electrode 112, a predetermined voltage may be applied from the DC power supply portion. When the predetermined voltage is applied, a potential difference may occur between the semiconductor substrate W and the RF electrode 112 due to the high DC voltage. Dielectric polarization may occur inside an insulator of an electrostatic chuck due to the generated potential difference. The electrostatic force may be generated by the dielectric polarization, and the RF electrode 112 may clamp the semiconductor substrate W using the electrostatic force.

When the chemical vapor deposition process is ended, the RF electrode 112 may remove the electrostatic force for de-chucking of the semiconductor substrate W. After the chemical vapor deposition process is ended, the first power supply portion 160 may block the voltage provided to the RF electrode 112.

The RF electrode 112 may include a circulation channel that is capable of cooling at a bottom side of the RF electrode 112. Also, a cooling gas, e.g., He gas, may be supplied between the RF electrode 112 and the semiconductor wafer W to precisely control the semiconductor substrate W temperature.

The resistance heating element 114 may be provided adjacent to the seating surface. The resistance heating element 114 may be provided under the RF electrode 112, e.g., the RF electrode 112 may be between the resistance heating element 114 and the seating surface. The resistance heating element 114 may be embedded in the platen 110. The resistance heating element 114 may generate heat through the DC voltage that is supplied from the DC power supply portion. The resistance heating element 114 may transmit the heat onto the semiconductor substrate W. For example, the resistance heating element 114 may be connected to a second power supply portion 162 (e.g., a second power supply) to receive power that generates the heat. In another example, the resistance heating element 114 may receive the power from a separate DC power source.

The sensor 116 may be provided adjacent to the resistance heating element 114 to obtain the temperature data from the resistance heating element 114. The sensor 116 may be embedded within the platen 110. For example, the sensor 116 may include a thermocouple (TC) sensor and a resistance temperature detector (RTD) sensor.

The sensor 116 may be connected to a control portion 164 for transmitting the temperature data. The control portion 164 may determine progress of the chemical vapor deposition process through the temperature data. For example, when the control portion 164 determines that the temperature of the semiconductor substrate W is high through the temperature data, the temperature of the resistance heating element 114 may be lowered through the second power supply portion 162.

The platen 110 may include a first material. The first material may include metallic or ceramic materials. For example, the metallic or the ceramic materials may include metals, metal oxides, metal nitrides, metal oxynitrides, or alloys thereof. The platen 110 may include, e.g., aluminum, aluminum oxide, aluminum nitride, aluminum oxynitride, or alloys thereof.

In example embodiments, as illustrated in FIG. 1, the shaft 120 may be provided under the platen 110 to support the platen 110. As illustrated in FIG. 3, the shaft 120 may have a central region CA (inner dashed circle in FIG. 3), and a peripheral region SA surrounding the central region CA (outer dashed circle in FIG. 3). The shaft 120 may be manufactured by a sintering or a green sheet method.

The shaft 120 may have spaces that are capable of accommodating the RF electrode 112, the RF rod 130 providing a passage for power, data, etc. to the resistance heating element 114 and the sensor 116, the heater rod 140, and the sensor rod 150, therein. In detail, as illustrated in FIG. 2, the shaft 120 may have a first through hole 40, e.g., extending through an entire height of the shaft 120, for accommodating the RF rod 130 therein (e.g., dashed channel in FIG. 2), a plurality of second through holes 42 (e.g., extending through an entire height of the shaft 120) for respectively accommodating the heater rods 140 therein, and at least one third through hole 44 (e.g., extending through an entire height of the shaft 120) for accommodating the sensor rod 150 therein.

In example embodiments, as illustrated in FIGS. 2 and 3, the first through hole 40 may be provided in the central region CA. The first through hole 40 may have a first central axis C1. The first central axis C1 of the first through hole 40 may be positioned on the same axis as a central axis of the shaft 120. The shaft 120 may have a shaft body that has a hollow structure through which the first through hole 40 is provided in the central region CA. The first through hole 40 may have a first diameter D1. For example, the first diameter D1 may be within a range of 12 mm to 20 mm.

In example embodiments, the shaft 120 may further include a second metal layer 122 covering an inner wall of the first through hole 40. The second metal layer 122 may include a metal material. The second metal layer 122 may block the RF rod 130 inside the first through hole 40 from an external electromagnetic field. The second metal layer 122 may surround the, e.g., entire, inner wall of the first through hole 40 and generate a Faraday cage effect. The second metal layer 122 may block an electrical phenomenon that is generated in the RF rod 130 from the heater rod 140 and the sensor rod 150 through the Faraday cage effect. For example, the second metal layer 122 may include nickel (Ni), antimony (Sb), bismuth (Bi), zinc (Zn), indium (In), palladium (Pd), platinum (Pt), aluminum (Al), Copper (Cu), molybdenum (Mo), titanium (Ti), gold (Au), silver (Ag), chromium (Cr), tin (Sn), or alloys thereof.

In example embodiments, as illustrated in FIG. 3, the second through hole 42 may be provided in the peripheral region SA. A plurality of second through holes 42 may be arranged adjacent to an outer surface of the shaft 120 in the peripheral region SA. The second through holes 42 may be arranged along a circumferential direction in the peripheral region SA, e.g., the second through holes 42 may be spaced apart from each other along an outer edge of the shaft 120 in the circumferential direction of the shaft 120. The second through hole 42 may have a second diameter D2, e.g., the second diameter D2 may be smaller than the first diameter D1. For example, the number of second through holes 42 may be within a range of two to twenty-four. For example, the second diameter D2 may be within a range of 2 mm to 6 mm.

The second through hole 42 may have a second central axis C2. The second central axis C2 of the second through hole 42 may be provided to be spaced apart from the first central axis C1 of the first through hole 40 by a first distance L1. For example, the first distance L1 may be within a range of 15 mm to 25 mm.

In example embodiments, as illustrated in FIG. 3, the third through hole 44 may be provided in the peripheral region SA. The third through hole 44 may be provided adjacent to the outer surface of the shaft 120 in the peripheral region SA. The third through hole 44 may have a third diameter D3. For example, the third diameter D3 may be within a range of 2 mm to 6 mm.

The third through hole 44 may have a third central axis C3. The third central axis C3 of the third through hole 44 may be provided to be spaced apart from the first central axis C1 of the first through hole 40 by a second distance L2. For example, the second distance L2 may be within a range of 15 mm to 25 mm.

The shaft 120 may include a second material having an insulating material. The second material may include ceramic materials. For example, the ceramic materials may include aluminum oxide, aluminum nitride, aluminum oxynitride, or alloys thereof. For example, referring to FIGS. 2-3, the shaft 120 may have a cylindrical shape formed of an insulating material, and the first to third through holes 40, 42, and 44 may extend through the cylindrical shape.

In example embodiments, as illustrated in FIG. 3, the RF rod 130 may include a RF line 132 through which current is transmitted, an insulating layer 134 surrounding the RF line 132, and a first metal layer 136 surrounding the insulating layer 134. The RF rod 130 may be provided in the first through hole 40 of the shaft 120. The RF rod 130 may extend along the, e.g., entire, first through hole 40 of the shaft 120, and may be electrically connected to the RF electrode 112. The RF rod 130 may extend within the hollow structure of shaft 120.

The RF line 132 may be electrically connected to the RF electrode 112, and the RF line 132 may transmit the current that generates the electrostatic force supplied from the first power supply portion 160. Since the current transmitted inside the RF line 132 has a high voltage, the RF line 132 may generate high decibels and noise.

The insulating layer 134 may surround and protect an, e.g., entire, outer surface of the RF line 132. The insulating layer 134 may insulate the RF line 132 from the outside. For example, the insulating layer 134 may include a polymer or a dielectric layer. For example, the insulating layer 134 may include aluminum nitride (AlN), polyimide (PI), lead oxide (PbO), polyhydroxystyrene (PHS), novolac, or the like.

The first metal layer 136 may cover an, e.g., entire, outer surface of the insulating layer 134. The first metal layer 136 may include the metal material. The first metal layer 136 may block the RF line 132 from an external electromagnetic field. The first metal layer 136 may surround the RF line 132, and may generate the Faraday cage effect. The first metal layer 136 may block the electrical phenomenon that is generated in the RF line 132 from the heater rod 140 and the sensor rod 150 through the Faraday cage effect. For example, the first metal layer 136 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

The RF rod 130 may have the same first central axis C1 as the first through hole 40. The RF rod 130 may have a fourth diameter D4. The fourth diameter D4 of the RF rod 130 may be smaller than the first diameter D1 of the first through hole 40. For example, the fourth diameter D4 may be within a range of 10 mm to 18 mm.

An outer surface of the RF rod 130 may be provided to be the spaced apart from the inner wall of the first through hole 40, e.g., an outer surface of the RF rod 130 may be radially spaced apart from an inner surface of the second metal layer 122. Since the outer surface of the RF rod 130 is spaced apart from the inner wall of the first through hole 40, the decibels and the noise transmitted from the RF rod 130 to the heater rod 140 and the sensor rod 150 may be reduced. The outer surface of the RF rod 130 may be spaced apart from the inner wall of the first through hole 40 by a third distance L3. For example, the third distance L3 may be within a range of 0.5 mm to 4 mm.

In example embodiments, the heater rods 140 may be provided in the second through holes 42 of the shaft 120, respectively. The heater rod 140 may extend along the second through hole 42 of the shaft 120, and may be electrically connected to the resistance heating element 114. The heater rod 140 may be electrically connected to the resistance heating element 114 to transmit the power supplied from the second power supply portion 162.

An outer surface of the heater rod 140 may, e.g., directly, contact an inner wall of the second through hole 42 of the shaft 120. Since the shaft 120 includes the second material having an insulating material, the heater rod 140 may be insulated from the outside by the shaft 120. The heater rod 140 might not have an insulating layer due to the shaft 120, e.g., the heater rod 140 may not require an insulating layer due to its position within the second through hole 42 of the shaft 120. Since the heater rod 140 might not have an insulating layer, the heater rod 140 may be provided within the shaft 120 without structural limitations. The heater rod 140 may be formed by being inserted into the second through hole 42 of the shaft 120.

The heater rod 140 may have a fifth diameter. The fifth diameter of the heater rod 140 may be equal to or smaller than the second diameter D2 of the second through hole 42. For example, the fifth diameter may be within a range of 2 mm to 6 mm.

The heater rod 140 may have the same second central axis C2 as the second through hole 42. The second central axis C2 of the heater rod 140 may be provided to be spaced apart from the first central axis C1 of the RF rod 130 by the first distance L1. For example, the first distance L1 may be within a range of 15 mm to 25 mm.

The heater rod 140 may include a third material. The third material may be a material having a thermal expansion coefficient similar to that of the second material of the shaft 120. Since the heater rod 140 has a similar thermal expansion coefficient as the shaft 120, when the heater rod 140 expands in the second through hole 42 of the shaft 120, the second through hole 42 may expand in the same way. Since the second through hole 42 expands the same as the heater rod 140, an external force applied to the shaft 120 from the heater rod 140 may be reduced. For example, the third material may include graphite.

In example embodiments, the sensor rod 150 may be provided in the third through hole 44 of the shaft 120. The sensor rod 150 may extend along the third through hole 44 of the shaft 120, and may be electrically connected to the sensor 116. The sensor rod 150 may transmit electrical signal data of the RF electrode 112 that is obtained from the sensor 116 to the control portion 164. The sensor rod 150 may transfer the temperature data of the resistance heating element 114 that is obtained from the sensor 116 to the control portion 164.

An outer surface of the sensor rod 150 may contact an inner wall of the third through hole 44 of the shaft 120. Since the shaft 120 includes the second material having the insulating material, the sensor rod 150 may be insulated from the outside by the shaft 120. The sensor rod 150 might not have the insulating layer due to the shaft 120. Since the sensor rod 150 might not have the insulating layer, the sensor rod 150 may be provided within the shaft 120 without structural limitations. The sensor rod 150 may be formed by being inserted into the third through hole 44 of the shaft 120.

The sensor rod 150 may have a sixth diameter. The sixth diameter of the sensor rod 150 may be equal to or smaller than the third diameter D3 of the third through hole 44. For example, the sixth diameter may be within a range of 2 mm to 6 mm.

The sensor rod 150 may have the same third central axis C3 as the third through hole 44. The third central axis C3 of the sensor rod 150 may be provided to be spaced apart from the first central axis C1 of the RF rod 130 by the first distance L1. For example, the first distance L1 may be within a range of 15 mm to 25 mm.

The sensor rod 150 may include a fourth material. The fourth material may be a material having a thermal expansion coefficient similar to that of the second material of the shaft 120. Since the sensor rod 150 has a similar thermal expansion coefficient as the shaft 120, when the sensor rod 150 expands in the third through hole 44 of the shaft 120, the third through hole 44 may expand in same way. Since the third through hole 44 expands the same as the sensor rod 150, an external force applied to the shaft 120 from the sensor rod 150 may be reduced. For example, the fourth material may include graphite.

As described above, the heater rod 140 provided into the second through hole 42 may be provided to be spaced apart from the RF rod 130 provided into the first through hole 40. Since the RF rod 130 is provided to be spaced apart from the inner wall of the first through hole 40, an empty space may be provided between the outer surface of the RF rod 130 and the inner wall of the first through hole 40, e.g., the empty space may be between the outer surface of the RF rod 130 and the inner wall of the second metal layer 122. The empty space may increase a distance from the RF rod 130 to the heater rod 140 and the sensor rod 150. The heater rod 140 and the sensor rod 150 may be protected from the decibels and the noise that are generated from the RF rod 130.

Also, the shaft 120 may be formed of an insulating material. Since the shaft 120 includes an insulating material, the heater rod 140 and the sensor rod 150 may not require an additional insulating layer, and therefore, the fifth diameter of the heater rod 140 and the sixth diameter of the sensor rod 150 may be smaller. As such, space utilization of the substrate stage 100 may be increased through the fifth diameter of the heater rod 140 and the sixth diameter of the sensor rod 150.

By way of summation and review, a strong current generating high decibel may be transmitted through an RF rod, and thus, the RF rod may generate high noise. In order to protect the heater rods and the sensor rods from the high decibel of the RF rod, a metal layer may be used to cover outer surfaces of the heater rods and the sensor rods. However, as the metal layer increases the diameters of the heater rod and the sensor rod, space limitations may increase.

In contrast, example embodiments provide a substrate stage including a structure that is capable of protecting a heater rod and a sensor rod from an RF rod, while increasing space utilization. Example embodiments also provide a substrate processing apparatus including such a substrate stage.

That is, the substrate stage, according to example embodiments, includes a heater rod inside a through hole of a shaft to be spaced apart from the RF rod in a different through hole of the shaft. Since the RF rod is spaced apart from an inner wall of its through hole, an empty space may be provided between an outer surface of the RF rod and the inner wall of its through hole, thereby further increasing a distance between the RF rod and the heater rod to protect the heater rod from decibels and noise generated from the RF rod. Also, the shaft may include an insulating material, thereby eliminating a need for an additional insulating layer on the heater rod, and as such, minimizing a diameter of the heater rod and increasing space utilization of the substrate stage through the heater rod.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate processing apparatus, comprising:

a chamber providing a space for performing a semiconductor process on a semiconductor substrate therein; and a substrate stage inside the chamber, the substrate stage being configured to support the semiconductor substrate, and the substrate stage including:

a platen having a seating surface to support the semiconductor substrate, the platen including a resistance heater and a radiofrequency (RF) electrode adjacent to the seating surface, a shaft contacting a lower surface of the platen, the shaft including a first through hole extending through an entire height of the shaft to end at the platen in a central region of the shaft and second through holes extending through the entire height of the shaft to end at the platen in a peripheral region of the shaft surrounding the central region of the shaft, an RF rod extending through the first through hole and spaced apart from an inner wall of the first through hole, the RF rod being electrically connected to the RF electrode, and heater rods extending through the second through holes, respectively, the heater rods being electrically connected to the resistance heater.

2. The substrate processing apparatus as claimed in claim 1, wherein:

the platen further includes a sensor configured to obtain temperature data of the resistance heater, the shaft further includes a third through hole extending through the entire height of the shaft to end at the platen in the peripheral region, and a sensor rod is positioned within the third through hole and is electrically connected to the sensor.

3. The substrate processing apparatus as claimed in claim 1, further comprising:

a first power supply electrically connected to the RF rod, the first power supply being configured to supply electrostatic force to the RF electrode to fix the semiconductor substrate on the seating surface; and a second power supply electrically connected to the heater rods, the second power supply being configured to supply power to the resistance heater to generate heat.

4. The substrate processing apparatus as claimed in claim 1, wherein a first diameter of the first through hole is within a range of 12 mm to 20 mm, and a second diameter of a second through hole among the second through holes is within a range of 2 mm to 6 mm.

5. The substrate processing apparatus as claimed in claim 1, wherein a second central axis of a second through hole among the second through holes is spaced apart from a first central axis of the first through hole by a first distance, the first distance being within a range of 15 mm to 25 mm.

6. The substrate processing apparatus as claimed in claim 1, wherein the second through holes are arranged along a circumferential direction adjacent to an outer surface of the shaft in the peripheral region.

7. The substrate processing apparatus as claimed in claim 1, wherein the RF rod includes:

an RF line configured to transmit current that generates electrostatic force;

an insulating layer surrounding the RF line; and a first metal layer surrounding the insulating layer.

8. The substrate processing apparatus as claimed in claim 1, wherein an outer surface of the RF rod is spaced apart from the inner wall of the first through hole by a second distance, the second distance being within a range of 0.5 mm to 4 mm.

9. The substrate processing apparatus as claimed in claim 1, wherein the shaft includes aluminum nitride, and the heater rods include graphite.

10. The substrate processing apparatus as claimed in claim 1, wherein the shaft further includes a second metal layer covering the inner wall of the first through hole.

11. A substrate processing apparatus, comprising:
a chamber providing a space where a deposition process is performed on a semiconductor substrate therein; and
a substrate stage inside the chamber, the substrate stage being configured to support the semiconductor substrate, and the substrate stage including:
a platen having a seating surface to support the semiconductor substrate, the platen including a radiofrequency (RF) electrode adjacent to the seating surface and a resistance heater under the RF electrode,
a shaft contacting a lower surface of the platen, the shaft including a first through hole extending through an entire height of the shaft to end at the platen in a central region of the shaft and second through holes extending through the entire height of the shaft to end at the platen in a peripheral region of the shaft surrounding the central region of the shaft,
an RF rod extending through the first through hole, the RF rod being electrically connected to the RF electrode,
a first power supply electrically connected to the RF rod, the first power supply being configured to supply electrostatic force to the RF electrode to fix the semiconductor substrate on the seating surface,
heater rods respectively within the second through holes, the heater rods being electrically connected to the resistance heater, and
a second power supply electrically connected to the heater rods, the second power supply being configured to supply power to the resistance heater to generate heat.

12. The substrate processing apparatus as claimed in claim 11, wherein:
the platen further includes a sensor configured to obtain temperature data of the resistance heater,
the shaft further includes a third through hole extending through the entire height of the shaft to end at the platen in the peripheral region of the shaft, and
a sensor rod is extending through the third through hole and electrically connected to the sensor.

13. The substrate processing apparatus as claimed in claim 11, wherein a first diameter of the first through hole is within a range of 12 mm to 20 mm, and a second diameter of a second through hole among the second through holes is within a range of 2 mm to 6 mm.

14. The substrate processing apparatus as claimed in claim 11, wherein a second central axis of a second through hole among the second through holes is spaced apart from a first central axis of the first through hole by a first distance, the first distance being within a range of 15 mm to 25 mm.

15. The substrate processing apparatus as claimed in claim 11, wherein the second through holes are arranged along a circumferential direction adjacent to an outer surface of the shaft in the peripheral region.

16. The substrate processing apparatus as claimed in claim 11, wherein the RF rod includes:
an RF line configured to transmit current that generates the electrostatic force;
an insulating layer surrounding the RF line; and
a first metal layer surrounding the insulating layer.

17. The substrate processing apparatus as claimed in claim 11, wherein an outer surface of the RF rod is spaced apart from an inner wall of the first through hole by a second distance, the second distance being within a range of 0.5 mm to 4 mm.

18. The substrate processing apparatus as claimed in claim 11, wherein the shaft includes aluminum nitride, and the heater rods include graphite.

19. The substrate processing apparatus as claimed in claim 11, wherein the shaft further includes a second metal layer covering an inner wall of the first through hole.

20. A substrate stage for a substrate processing apparatus, the substrate stage comprising:
a platen having a seating surface to support a semiconductor substrate, the platen including a radiofrequency (RF) electrode adjacent to the seating surface, a resistance heater under the RF electrode, and a sensor configured to obtain electrical signal data of the RF electrode and temperature data of the resistance heater;
a shaft contacting a lower surface of the platen, the shaft having a first through hole extending through an entire height of the shaft to end at the platen in a central region of the shaft, second through holes extending through the entire height of the shaft to end at the platen in a peripheral region of the shaft surrounding the central region, and a third through hole extending through the entire height of the shaft to end at the platen in the peripheral region of the shaft;
an RF rod extending through the first through hole and spaced apart from an inner wall of the first through hole and electrically connected to the RF electrode;
a first power supply electrically connected to the RF rod, the first power supply being configured to supply electrostatic force to the RF electrode to magnetically fix the semiconductor substrate on the seating surface;
heater rods extending through the second through holes, respectively, and electrically connected to the resistance heater;
a second power supply electrically connected to the heater rods, the second power supply being configured to supply power to the resistance heater to generate heat; and
a sensor rod extending through the third through hole and electrically connected to the sensor.

* * * * *